United States Patent [19]

Kawabe et al.

[11] Patent Number: 5,130,224
[45] Date of Patent: Jul. 14, 1992

[54] POSITIVE-WORKING PHOTORESIST COMPOSITION

[75] Inventors: Yasumasa Kawabe; Tadayoshi Kokubo, both of Shizuoka, Japan

[73] Assignee: Fuji Photo Film Co., Ltd., Kanagawa, Japan

[21] Appl. No.: 486,327

[22] Filed: Feb. 28, 1990

[30] Foreign Application Priority Data

Feb. 28, 1989 [JP] Japan .................. 1-46848

[51] Int. Cl.$^5$ ..................... G03F 7/012; G03F 7/023; G03C 1/61
[52] U.S. Cl. ..................... 430/191; 430/165; 430/167; 430/192; 430/193; 430/196; 430/197; 430/512
[58] Field of Search ............... 430/191, 192, 196, 512, 430/197, 165, 167, 193

[56] References Cited

U.S. PATENT DOCUMENTS

| | | | |
|---|---|---|---|
| 3,666,473 | 5/1972 | Colom et al. | 430/192 |
| 4,626,492 | 12/1986 | Eilbeck | 430/191 |
| 4,828,960 | 5/1989 | Hertog | 430/191 |
| 4,882,260 | 11/1989 | Kohara et al. | 430/191 |

FOREIGN PATENT DOCUMENTS

| | | |
|---|---|---|
| 55-36836 | 3/1980 | Japan . |
| 55-36837 | 3/1980 | Japan . |
| 55-36838 | 3/1980 | Japan . |
| 59-142536 | 8/1984 | Japan . |
| 59-142537 | 8/1984 | Japan . |
| 59-142538 | 8/1984 | Japan . |
| 86/07473 | 12/1986 | PCT Int'l Appl. . |

Primary Examiner—Charles L. Bowers, Jr.
Assistant Examiner—Christopher G. Young
Attorney, Agent, or Firm—Sughrue, Mion, Zinn, Macpeak & Seas

[57] ABSTRACT

A positive-working photoresist composition is disclosed comprising an alkali-soluble resin and a 1,2-naphthoquinonediazido group-containing compound, and further contains at least one light absorber selected from the group consisting of the azo compounds represented by the following formulae (I), (II), (III), (IV), (V) and (VI) in a proportion of from about 0.1 to about 10% by weight based on the total solid content of the photoresist composition, and is useful for forming a fine pattern of excellent quality even on a substrate with unevenness or high reflectivity:

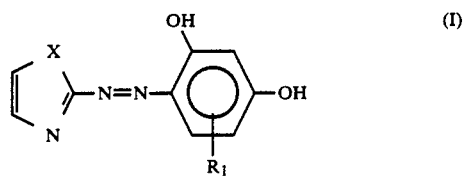

(I)

wherein $R_1$ represents a hydrogen atom or a lower alkyl group; and X represents a sulfur atom or an oxygen atom;

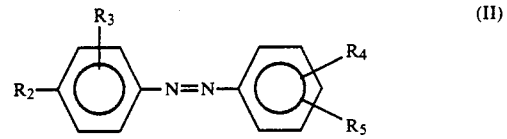

(II)

wherein $R_2$ represents a hydroxyl group or a di(lower alkyl)amino group; $R_3$ and $R_4$ each represents a hydrogen atom or a carboxyl group, provided that at least one of $R_3$ and $R_4$ represents a carboxyl group; and $R_5$ represents a hydrogen atom, a hydroxyl group or a nitro group;

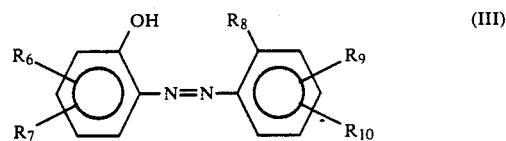

(III)

wherein $R_6$ and $R_7$ each represents a hydrogen atom, a lower alkyl group or a nitro group; $R_8$ represents a hydrogen atom, a hydroxyl group or an amino group; $R_9$ and $R_{10}$ each represents a hydrogen atom, an amino group, a lower alkyl group, a nitro group or an acylamino group;

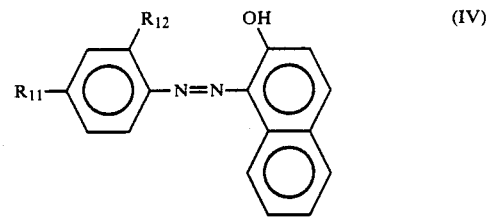

(IV)

wherein $R_{11}$ and $R_{12}$ each represents a lower alkyl group or a nitro group, provided that at least one of $R_{11}$ and $R_{12}$ represents a nitro group;

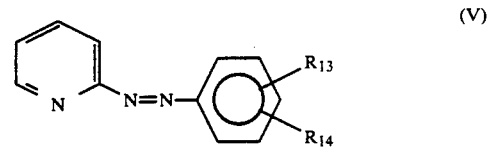

(V)

wherein $R_{13}$ and $R_{14}$ each represents a hydrogen atom, a hydroxyl group, a nitro group or a lower alkyl group, provided that at least one of $R_{13}$ and $R_{14}$ represents a hydroxyl group; and

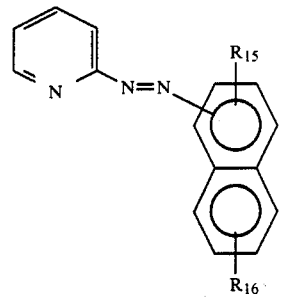
(VI)
wherein $R_{15}$ and $R_{16}$ each represents a hydrogen atom or a hydroxyl group, provided that at least one of $R_{15}$ and $R_{16}$ represents a hydroxyl group.
10 Claims, No Drawings

POSITIVE-WORKING PHOTORESIST COMPOSITION

FIELD OF THE INVENTION

This invention relates to a positive-working photoresist composition comprising an alkali-soluble resin and a 1,2-naphthoquinonediazide compound. This improved positive-working photoresist composition provides excellent fine pattern formation even on a substrate having an uneven or highly reflective surface.

BACKGROUND OF THE INVENTION

As a positive-working photoresist composition (hereinafter referred to as a "photoresist"), a composition containing an alkali-soluble resin and a naphthoquinonediazide compound as a photosensitive material is generally used. For example, novolak type phenol resin/naphthoquinonediazide-substituted compounds are described in U.S. Pat. Nos. 3,666,473, 4,115,128 and 4,173,470; and cresol-formaldehyde novolak resin/trihydroxybenzophenone-1,2-naphthoquinonediazidosulfonic acid esters are described in L. F. Thompson, *Introduction to Microlithography*, No. 219, pp. 112-121 (American Chemical Society, 1983).

Novolak resin is useful as a binder for a photoresist because it dissolves without swelling in an aqueous alkali solution and when used to form a mask for etching it provides high durability or resistance to plasma etching.

The 1,2-naphthoquinonediazide compounds which are used as photosensitive material, function as dissolution inhibitors for reducing the alkali solubility of a novolak resin. But when these compounds are decomposed by irradiation with light they form alkali-soluble material which acts to sharply increase the alkali solubility of a novolak resin. This change in solubility resulting from exposure to light makes these naphthoquinonediazide compounds particularly useful as photosensitive materials for a positive-working photoresist.

Many positive-working photoresist compositions containing a novolak resin and a naphthoquinonediazide series photosensitive material have been developed and practically used.

Although such photoresists are characterized by having the high resolution described above, they tend to be affected by light reflected by a substrate with high reflectivity, such as aluminum (or the influence of halation). This results in the formation of a blurred image or causes difficulty in controlling the line width of the image. These problems are exacerbated when the substrate has fluctuations in the surface level.

In order to prevent halation, the addition of a light-absorbing material has been proposed. For example, JP-B-51-37562 (the term "JP-B" as used herein refers to an "examined Japanese patent publication") discloses a method for preventing the decrease in resolution which comprises reducing the permeability of light into a photoresist layer by incorporating Oil Yellow of the formula:

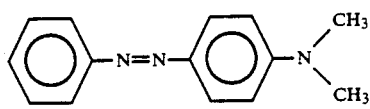

Oil Yellow is a dye having light absorption characteristics in the ultraviolet region. As a light absorber, Oil Yellow decreases the light reflected back from the substrate surface into the photoresist layer. Thus, light that would be refracted into areas which should not be irradiated with ultraviolet rays is reduced and the resulting reduction in resolution is prevented.

However, the use of Oil Yellow still has defects. A part of the dye used as a light absorber is sublimed from the photoresist film during the prebaking conducted to remove the residual solvent and heightens its adhesiveness to the substrate after coating. This sublimation results in the halation-preventing effect being significantly lowered.

JP-A-55-36838 (the term "JP-A" as used herein refers to a "published unexamined Japanese patent application") discloses 1-alkoxy-4-(4'-N,N-dialkylaminophenylazo)benzene derivatives as light absorbers that have improved sublimation resistance during prebaking. However, incorporation of these light absorbers into conventional positive-working photoresists is not advantageous since it causes a significant reduction in the sensitivity of the resulting photoresists.

The alkali-soluble azo compounds disclosed in JP-A-59-142538 do not have the disadvantage of causing a reduction or wide fluctuation in sensitivity, but these compounds are still insufficient to prevent halation. In addition, they cannot resolve the rapidly diminishing dimensions required by the semiconductor industry.

SUMMARY OF THE INVENTION

An object of this invention is to provide a positive-working photoresist composition which overcomes the defects inherent in conventional photosensitive compositions in order to cope with the reduction of processing dimensions of semiconductor elements, by forming a resist pattern which exhibits excellent dimensional stability.

More specifically, an object of this invention is to provide a positive-working photoresist composition which has high sensitivity, undergoes no deterioration in resist properties under prebaking conditions, has excellent antihalation properties, and forms resist patterns with high resolution.

As a result of extensive studies on various light absorbers, the present inventors have found that the above-described object can be attained by adding a light absorber of certain azo compounds to a positive-working photosensitive composition comprising a quinonediazide compound and an alkali-soluble novolak resin, resulting in the present invention.

More specifically, the present invention relates to a positive-working photoresist composition which contains a positive-working composition comprising an alkali-soluble resin and a 1,2-naphthoquinonediazido group-containing compound, and at least one light absorber selected from the group consisting of the azo compounds represented by the following formulae (I), (II), (III), (IV), (V) and (VI) in a proportion of from about 0.1 to about 10% by weight based on the total solid content of the photoresist composition:

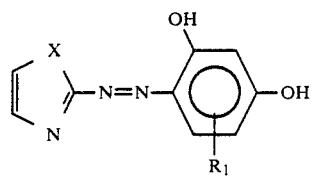 (I)

wherein $R_1$ represents a hydrogen atom or a lower alkyl group; and X represents a sulfur atom or an oxygen atom;

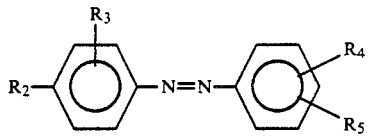 (II)

wherein $R_2$ represents a hydroxyl group or a di(lower alkyl)amino group; $R_3$ and $R_4$ each represents a hydrogen atom or a carboxy group, provided that at least one of $R_3$ and $R_4$ represents a carboxyl group; and $R_5$ represents a hydrogen atom, a hydroxyl group or a nitro group;

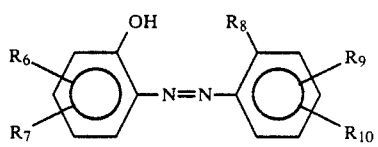 (III)

wherein $R_6$ and $R_7$ each represents a hydrogen atom, a lower alkyl group or a nitro group; $R_8$ represents a hydrogen atom, a hydroxyl group or an amino group; $R_9$ and $R_{10}$ each represents a hydrogen atom, an amino group, a lower alkyl group, a nitro group or an acylamino group;

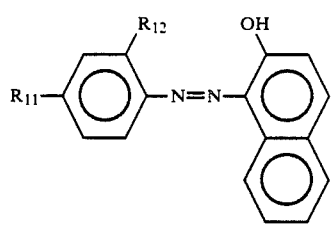 (IV)

wherein $R_{11}$ and $R_{12}$ each represents a lower alkyl group or a nitro group, provided that at least one of $R_{11}$ and $R_{12}$ represents a nitro group;

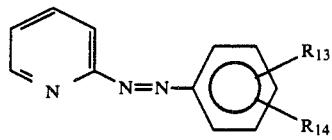 (V)

wherein $R_{13}$ and $R_{14}$ each represents a hydrogen atom, a hydroxyl group, a nitro group or a lower alkyl group, provided that at least one of $R_{13}$ and $R_{14}$ represents a hydroxyl group; and

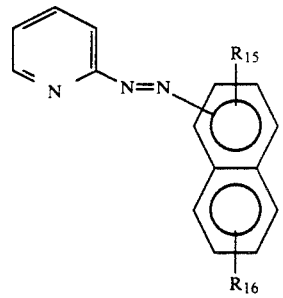 (VI)

wherein $R_{15}$ and $R_{16}$ each represents a hydrogen atom or a hydroxyl group, provided that at least one of $R_{15}$ and $R_{16}$ represents a hydroxyl group.

DETAILED DESCRIPTION OF THE INVENTION

Specific examples of light absorbers which can be used in the present invention include the following compounds. However, the invention should not be construed as being limited to these examples.

Examples of the light absorbers represented by the formula (I) include the following compounds:

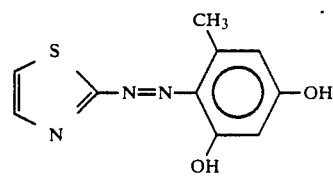 (I-1)

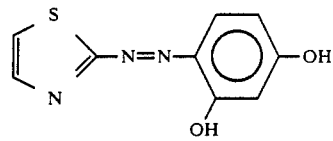 (I-2)

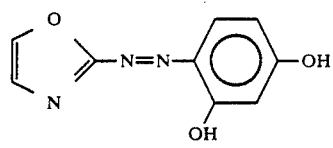 (I-3)

Examples of the light absorbers represented by the formula (II) include the following compounds:

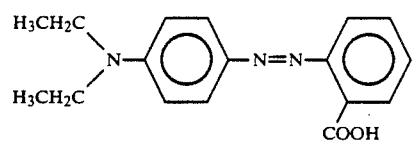 (II-1)

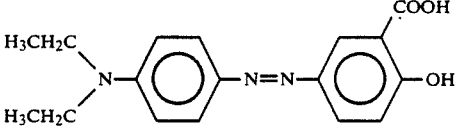 (II-2)

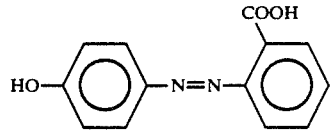 (II-3)

-continued
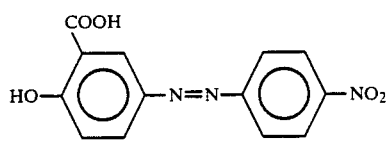 (II-4)
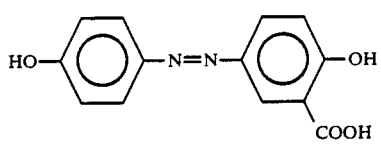 (II-5)
Examples of the light absorbers represented by the formula (III) include the following compounds:
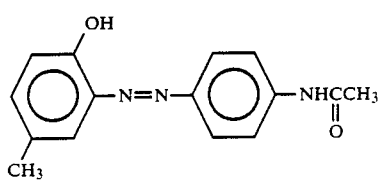 (III-1)
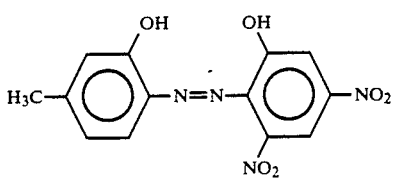 (III-2)
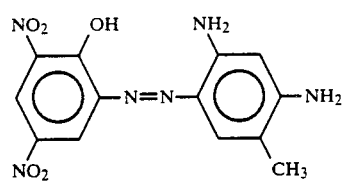 (III-3)
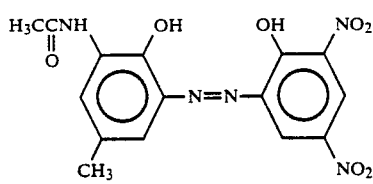 (III-4)
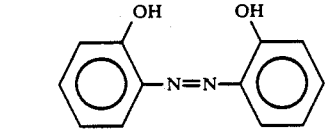 (III-5)
Examples of the light absorbers represented by the formula (IV) include the following compounds:
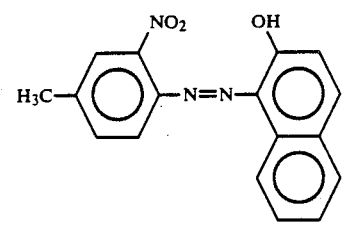 (IV-1)
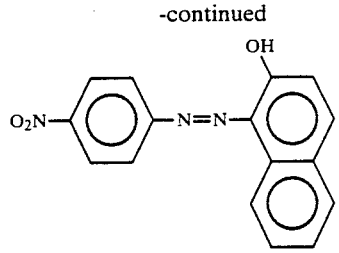 (IV-2)
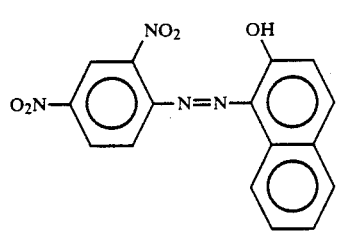 (IV-3)
Examples of the light absorbers represented by the formula (V) include the following compounds:
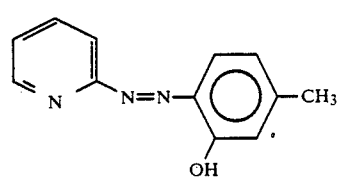 (V-1)
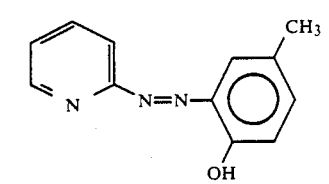 (V-2)
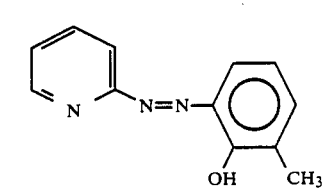 (V-3)
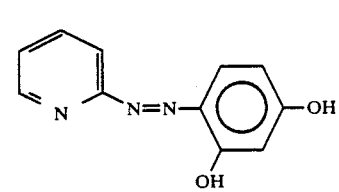 (V-4)
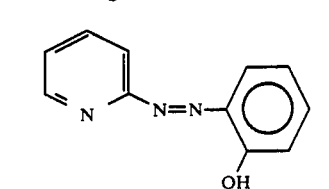 (V-5)

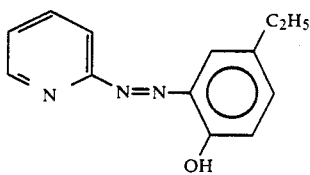
(V-6)

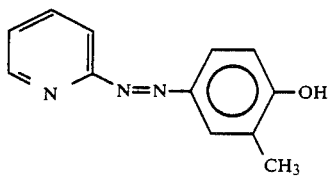
(V-7)

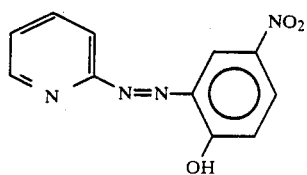
(V-8)

Examples of the light absorbers represented by the formula (VI) include the following compounds:

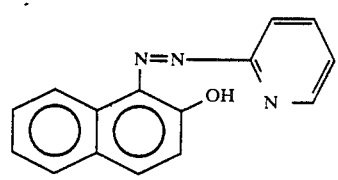
(VI-1)

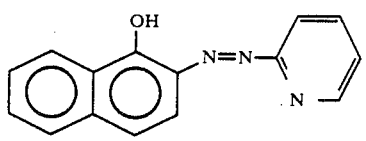
(VI-2)

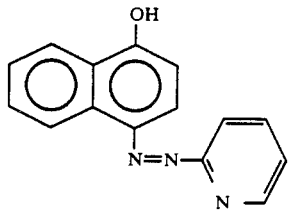
(VI-3)

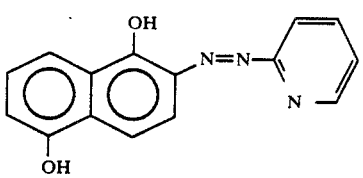
(VI-4)

The light absorbers as illustrated above can be easily prepared by known methods, for example, by combining aromatic diazonium salts with substituted phenols to produce azo compounds as described by R. Meldola et al., *J. Chem. Soc.*, 65, 834 (1894); R. Nietzki et al., *Ber.*, 19, 1282 (1886); I. E. Boni et al., *Chimica*, 34, 443 (1958); K. Cheng et al., *Ber.*, 39, 4058 (1906); C. Liebermann, *Ber.*, 16, 2860 (1883); F. Lindstrom, *Anal. Chem.*, 32, 1123 (1960). However, preparation methods thereof are not necessarily limited to the above-described method.

The light absorbers of this invention can be added to the photoresist composition alone or in combinations of two or more, and in a proportion of 0.1 to 10 wt%, preferably 0.3 to 5 wt%, based on the total solid content of the composition. When light absorber is used in an amount lower than 0.1 wt%, an insufficient antihalation effect results. On the other hand, when light absorber is used in amounts greater than 10 wt%, it tends to cause precipitation.

The alkali-soluble resins which can be used in this invention include novolak resins, acetone-pyrogallol resins, and polyhydroxystyrenes and derivatives thereof such as copolymers of polyhydroxystyrene with maleic anhydride, N-(hydroxyphenyl)maleimide or hydroxy-α-methylstyrene. In particular, novolak resins are preferred, and are obtained by condensing the prescribed monomer as a main component with an aldehyde in the presence of an acid catalyst.

Specific examples of the above monomers include phenol; cresols such as m-cresol, p-cresol, and o-cresol; xylenols such as 2,5-xylenol, 3,5-xylenol, 3,4-xylenol, and 2,3-xylenol; alkylphenols such as o-ethylphenol, m-ethylphenol, p-ethylphenol, and p-t-butylphenol; alkoxyphenols such as p-methoxyphenol, m-methoxyphenol, 3,5-dimethoxyphenol, 2-methoxy-4-methylphenol, m-ethoxyphenol, m-propoxyphenol, p-propoxyphenol, m-butoxyphenol, and p-butoxyphenol; bisalkylphenols such as 2-methyl-4-isopropylphenol; and other aromatic hydroxy-substituted compounds such as o-chlorophenol, m-chlorophenol, p-chlorophenol, dihydroxybiphenyls, bisphenol A, phenylphenol, resorcinol, and naphthol. These compounds can be used alone or in combinations of two or more. However, the monomers are not limited to the above-described specific examples.

Specific examples of aldehydes which can be used in this invention include formaldehyde, paraformaldehyde, acetaldehyde, furfural, chloroacetaldehyde, and acetals thereof, e.g., chloroacetaldehyde diethylacetal. Of these aldehydes, formaldehyde is particularly preferred.

Specific examples of acid catalysts which can be used include hydrochloric acid, sulfuric acid, formic acid, acetic acid, oxalic acid and the like.

It is desirable that a novolak resin thus obtained should have a weight average molecular weight ranging from about 2,000 to about 30,000. If the molecular weight is less than 2,000, the film thickness in the unexposed area of the resist film decreases greatly upon development, whereas if the molecular weight exceeds 30,000, the developing speed is reduced. A particularly preferred range of the molecular weight is from 6,000 to 20,000.

The term "weight average molecular weight" as used herein for novolak resins refers to the molecular weight converted to a polystyrene basis in gel permeation chromatography.

The 1,2-naphthoquinonediazide photosensitive compounds which can be used in this invention are esters prepared from a polyhydroxy aromatic compound and 1,2-naphthoquinonediazido-5-sulfonic acid, 1,2-naphthoquinonediazido-4-sulfonic acid or 1,2-benzoquinonediazido-4-sulfonic acid.

Specific examples of polyhydroxy aromatic compounds which can be used include polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3',4',5'-hexahydroxybenzophenone, and 2,3,4,3',4',5'-hexahydroxybenzophenone; polyhydroxyphenylalkylketones such as 2,3,4-trihydroxyacetophenone, and 2,3,4-trihydroxyphenylhexylketone; bis-[(poly)hydroxyphenyl]alkanes such as bis(2,4-dihydroxyphenyl)methane, bis(2,3,4-trihydroxyphenyl)methane, and bis(2,4-dihydroxyphenyl)propane-1; polyhydroxybenzoates such as propyl 3,4,5-trihydroxybenzoate, and phenyl 3,4,5-trihydroxybenzoate; bis(polyhydroxybenzoyl)alkanes such as bis(2,3,4-trihydroxybenzoyl)methane; bis(polyhydroxybenzoyl)aryls such as bis(2,3,4-trihydroxybenzoyl)benzene; alkylene-di(polyhydroxybenzoate)'s such as ethyleneglycoldi(3,5-dihydroxybenzoate); polyhydroxybiphenyls such as 3,5,3',5'-biphenyltetrol, 2,4,2',4,-biphenyltetrol, 2,4,6,3',5'-biphenylpentol, and 2,4,6,2',4',6'-biphenylhexol; polyhydroxytriphenylmethanes such as 4,4',3'',4''-tetrahydroxy-3,5,3',5'-tetramethyltriphenylmethane, 4,4',2'',3'',4''-pentahydroxy-3,5,3',5'-tetramethyltriphenylmethane, and 2,3,4,2',3',4',3'',4''-octahydroxy-5,5'-diacetyltriphenylmethane; polyhydroxyspirobi-indanes such as 3,3,3',3'-tetramethyl-1,1'-spirobi-indane-5,6,5',6'-tetrol, 3,3,3',3'-tetramethyl-1,1'-spirobi-indane-5,6,7,5',6',7'-hexol, 3,3,3',3'-tetramethyl-1,1'-spirobi-indane-4,5,6,4',5',6'-hexol, and 3,3,3',3'-tetramethyl-1,1'-spirobi-indane-4,5,6,5',6',7'-hexol; flavonoid dyes such as quercetin and rutin; and the like.

In addition, naphthoquinonediazide esters of polymers such as acetone-pyrogallol resins, novolak resins, polyhydroxystyrenes and the like can also be used.

The photosensitive compounds described above can be used in an amount of from about 5 to about 100 parts by weight, preferably from 10 to 50 parts by weight, per 100 parts by weight of the alkali-soluble resin. If the ratio of the photosensitive compound to the novolak resin is smaller than 5/100, a remaining rate of the resist film decreases to a great extent, whereas if the ratio is greater than 100/100, the sensitivity and the solubility of the composition in solvents decrease.

The photoresist composition of this invention can further contain a polyhydroxy compound for increasing its solubility in a developer. Preferred examples of the polyhydroxy compound are phenols, resorcin, phloroglycin, 2,3,4-trihydroxybenzophenone, 2,3,4,4'-tetrahydroxybenzophenone, 2,3,4,3',4',5'-hexahydroxybenzophenone, acetonepyrogallol condensation resins, and phloroglycide. The polyhydroxy compound can be used generally in an amount not exceeding about 100 parts by weight, preferably from 5 to 50 parts by weight, per 100 parts by weight of the quinonediazide photosensitive compound of this invention.

A solution of photosensitive composition can be obtained by dissolving the photosensitive compound of this invention and the alkali-soluble novolak resin at the above-described ratio in an appropriate solvent.

Solvents for dissolving the photosensitive compound in this invention and the alkali-soluble novolak resin include ketones such as methyl ethyl ketone, and cyclohexanone; alcohol ethers such as ethylene glycol monomethyl ether and ethylene glycol monoethyl ether; ethers such as dioxane and ethylene glycol dimethyl ether; cellosolve esters such as methyl cellosolve acetate and ethyl cellosolve acetate; fatty acid esters such as butyl acetate, methyl lactate, and ethyl lactate; halogenated hydrocarbons such as 1,1,2-trichloroethylene; and highly polar solvents such as dimethylacetamide, N-methylpyrrolidone, dimethylformamide, and dimethyl sulfoxide. These solvents may be used alone or as a mixture thereof. Of these solvents, cyclohexanone, ethyl cellosolve acetate, methyl lactate and ethyl lactate are preferred with ethyl cellosolve acetate and ethyl lactate being more preferred.

The positive-working photoresist composition of this invention may, if desired, contain a plasticizer, an adhesion promoter, a surface active agent, and other additives.

Specific examples of such additives are plasticizers such as stearic acid, acetal resins, phenoxy resins, and alkyd resins; adhesion promoters such as hexamethyldisiliazane and chloromethylsilane; and surface active agents such as nonylphenoxy poly(ethyleneoxy)ethanol and octylphenoxy poly(ethyleneoxy)ethanol. Amounts of these additives can be suitably selected by the skilled artisan depending upon the desired object of the photoresist composition.

The positive-working photoresist composition of this invention is coated on a base plate which is used for the production of precise integrated circuit elements (e.g., a silicon wafer having a silicon dioxide coating) by any suitable conventional coating method such as spin coating or roller coating. By exposing the layer formed through a mask and developing the layer, good resist patterns can be obtained. The composition of this invention can produce a resist image of excellent quality even when a substrate with high reflectivity is used. Coating methods, exposure methods and developing methods can be appropriately selected from those well known in the art.

Typically, the positive-working photoresist of this invention is coated on a semiconductor wafer or other base plate such as glass, ceramic, or metal by a spin coating method or a roller coating method at a thickness of from about 0.5 $\mu$m to 3 $\mu$m. Thereafter, the resist layer thus formed is dried by heating. A circuit or other pattern is printed on the resist layer by ultraviolet light through an exposure mask; and the resist layer is developed to provide a positive image. By etching the base plate using the positive image as a mask, a pattern is applied to the base plate. Typical applications of the invention include the production of semiconductor elements such as integrated circuits (IC's); the production of circuit base plates such as liquid crystals, thermal heads; and other photofabrication production methods.

For developing the positive-working photoresist composition of this invention, any conventional aqueous solution of alkali developer can be used, including, e.g., inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethyl ethanolamine and triethanolamine; quaternary ammonium salts such as tetramethylammonium hydroxide and tetraethylammonium hydroxide; and cyclic amines such as pyrrole and piperidine.

Furthermore, the aqueous solution of the alkali developer described above can contain a suitable amount of an alcohol, a surface active agent, and other additives known in the art.

The positive-working photoresist composition of this invention is capable of forming a photoresist having a variety of excellent properties such as the ability to control line width, sensitivity, resolution, and sublimation resistance. Accordingly, the composition is suitable for use in fine fabrication.

The present invention is now illustrated in more detail by reference to the following examples and comparative examples. However, the present invention should not be construed as being limited to these examples. Unless otherwise indicated, all percentages, parts, ratios and the like are by weight.

EXAMPLE 1

A photoresist base was prepared by dissolving 100 parts by weight of a novolak resin (m-cresol/p-cresol=40/60 (by mole), molecular weight=7,200)

mask pattern as determined with a scanning electron microscope.

The sublimation resistance is expressed in terms of the ratio between the absorbances of the resist composition coated on a glass wafer at 436 nm determined using a spectrophotometer after and before baking at 90° C. for 30 minutes in a convection oven.

The antihalation property was evaluated by observing the resist pattern under a scanning electron microscope and examining the form of the pattern side wall. The resist having excellent pattern side wall is rated as "good", and the resist having no deformed pattern side wall and that having a deformed pattern side wall due to halation are rated as "usable" and "poor", respectively.

TABLE 1

| Example No. | Light Absorber | Amount Added (wt %) | Sensitivity | Resolution (micron) | Sublimation Resistance | Antihalation Property* | Stability to Precipitation** |
|---|---|---|---|---|---|---|---|
| Example 1 | 4-(2-Thiazolylazo)-resorcinol | 2.5 | 0.9 | 0.70 | 0.99 | A | ○ |
| Example 2 | 5-(4-Nitrophenylazo)-salicylic acid | 3.0 | 1.1 | 0.70 | 0.98 | A | ○ |
| Example 3 | 4,6-Dinitro-4'-methyl-2,2'-azodiphenol | 2.5 | 1.4 | 0.70 | 0.99 | A | ○ |
| Example 4 | 1-(4-Nitrophenylazo)-2-naphthol | 2.5 | 1.2 | 0.70 | 0.98 | A | ○ |
| Example 5 | 4-(2-Pyridylazo)-resorcinol | 2.5 | 0.90 | 0.70 | 0.99 | A | ○ |
| Example 6 | 1-(2-Pyridylazo)-2-naphthol | 3.0 | 1.30 | 0.70 | 0.99 | A | ○ |
| Comparative Example 1 | None | — | 1.0 | 0.80 | — | C | — |
| Comparative Example 2 | 4-Dimethylamino-azobenzene | 3.0 | 4.8 | 0.70 | 0.81 | A | ○ |
| Comparative Example 3 | 2,4-Dihydroxyazo-benzene | 2.5 | 1.5 | 0.80 | 0.97 | B | x |

*A: good; B: usable; C: poor
**Precipitation of light-absorbing material upon storage for 30 days at 40° C.: ○: no precipitation was observed; x: precipitation was observed.

obtained by condensing m-cresol and p-cresol with formaldehyde using oxalic acid as a catalyst, and 28 parts by weight of 1,2-naphthoquinonediazido-5-sulfonic acid ester of 2,3,4,4'-tetrahydroxybenzophenone (average esterification ratio=75%) in 320 parts by weight of ethyl cellosolve acetate. In the resulting photoresist base was dissolved 4-(2-thiazolylazo)resorcinol (corresponding to the Compound Example (I-2) of this invention) at a concentration of 2.5 wt% on a solid basis. The resulting solution was filtered through a 0.2-micron microfilter to prepare a photoresist composition.

The thus prepared photoresist composition was coated on an aluminum film-laminated silicon wafer by a spin coating, and dried at 90° C. for 30 minutes under nitrogen atmosphere in a convection oven to obtain a resist film 1.5 microns thick. After exposure using a reduced projection exposure apparatus, the resist film was developed for 1 minute with a 2.38% aqueous solution of tetramethylammonium hydroxide, washed with water for 30 seconds, and dried. The thus formed resist pattern was observed under a scanning electron microscope to evaluate the resist quality. The results obtained by evaluation are shown in Table 1.

The sensitivity is defined as the reciprocal of the exposure required for reproduction of the 1.0-micron mask pattern, and is shown as a relative value with the sensitivity of Comparative Example 1 being taken as 1.0.

The resolution is expressed in terms of the minimum width of a line that can be reproduced with a 1.5-micron As is apparent from the results shown in Table 1 above, the positive-working photoresist composition according to the present invention was excellent in all the evaluated properties: sensitivity, resolution, sublimation resistance, and antihalation property.

In addition, even when the positive-working photoresist composition of this invention was allowed to stand in the form of a solution for 30 days at a temperature of 40° C., no precipitate of light-absorbing agent was observed.

EXAMPLES 2 TO 4

Each of the photoresist composition was prepared in the same manner as described in Example 1, except that 5-(4-nitrophenylazo)salicylic acid (Compound Example II-4), 4,6-dinitro-4,-methyl-2,2'-azodiphenol Example III-2) or 1-(4-nitrophenylazo)-2-naphthol (Compound Example IV-2) was dissolved in the photoresist base of Example 1 in proportions of 3.0 wt%, 2.5 wt% or 2.5 wt% on a solid basis, respectively, in place of 2.5 wt% of 4-(2-thiazolylazo)resorcinol. These photoresist compositions were also evaluated in the same manner as described in Example 1. The results are shown in Table 1 above.

EXAMPLES 5 AND 6

Each of the photoresist compositions was prepared in the same manner as described in Example 1, except that 4-(2-pyridylazo)resorcinol (Compound Example V-4) or 1-(2-pyridylazo)-2-naphthol (Compound Example VI-1) was dissolved in the photoresist base of Example 1 in proportions of 2.5 wt% and 3.0 wt% on a solid basis, respectively, in place of 2.5 wt% of 4-(2-thiazolylazo)-resorcinol. These photoresists were also evaluated in the same manner as described in Example 1, and results similar to those in Example 1 were obtained. These results are also shown in Table 1 above.

COMPARATIVE EXAMPLE 1

A photoresist composition was prepared in the same manner as described in Example 1, except that no light absorber as recited in this invention was used. The resulting photoresist composition was evaluated in the same manner as described in Example 1, and the results obtained are also shown in Table 1 above.

The minimum line width of the pattern obtained was 0.80 micron. However, due to the adverse influence of halation, a marked jaggedness was observed on the side wall of the pattern.

COMPARATIVE EXAMPLE 2

A photoresist composition was prepared and evaluated in the same manner as described in Example 1, except that a known light absorber, Oil Yellow (4-dimethylaminoazobenzene), was added in a proportion of 3.0 wt% on a solid basis to the photoresist base prepared in Example 1 in place of the light absorber described in this invention. The results obtained are also shown in Table 1 above.

The minimum line width of the pattern obtained was 0.70 micron, and no jaggedness was observed on the side wall of the pattern. However, the sensitivity was markedly low, and the ratio between the absorbances of the baked and unbaked resist compositions was 0.81, indicating that the sublimation resistance was inferior.

COMPARATIVE EXAMPLE 3

A photoresist composition was prepared and evaluated in the same manner as described in Example 1, except that a known alkali-soluble light absorber, 2,4-dihydroxyazobenzene, was added in a proportion of 2.5 wt% on a solid basis to the photoresist base prepared in Example 1 in place of the light absorber of this invention.

The sensitivity obtained was high, the minimum line width of the pattern formed was 0.80 micron, and the jaggedness on the side wall of the pattern was not so remarkable. However, upon storage for 30 days at 40° C., a precipitate of light absorber was observed in the resist solution.

EXAMPLE 7

A photoresist base was prepared by dissolving 100 parts by weight of the novolak resin prepared in Example 1 and 30 parts by weight of 1,2-naphthoquinonediazido-5-sulfonic acid ester of 2,3,4,4'-tetrahydroxybenzophenone (average esterification ratio=70%) in 350 parts by weight of ethyl lactate. In the resulting photoresist base was dissolved 4-(2-thiazolylazo)-resorcinol (corresponding to the Compound Example (I-2) of this invention) at a concentration of 3.0 wt% on a solid basis. The resulting solution was filtered through a 0.2-micron microfilter to prepare a photoresist composition.

The photoresist composition was then coated on an aluminum film-laminated silicon wafer and evaluated in the same manner as described in Example 1. The results obtained are shown in Table 2 below.

TABLE 2

| Example No. | Sensitivity | Resolution (micron) | Sublimation Resistance | Antihalation Property | Stability to Precipitation |
| --- | --- | --- | --- | --- | --- |
| 7 | 1.1 | 0.70 | 0.99 | A | c |

While the invention has been described in detail and with reference to specific embodiments thereof, it will be apparent to one skilled in the art that various changes and modifications can be made therein without departing from the spirit and scope thereof.

What is claimed is:

1. A positive-working photoresist composition which comprises an admixture of (a) an alkali-soluble resin, (b) a 1,2-naphthoquinonediazido group-containing compound, and (c) at least one light absorber selected from the group consisting of the azo compounds represented by the following formulae (I), (V) and (VI) in a proportion of from about 0.1 to about 10% by weight based on the total solid content of the photoresist composition:

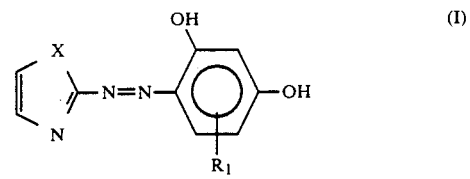

wherein $R_1$ represents a hydrogen atom or a lower alkyl group; and X represents a sulfur atom or an oxygen atom:

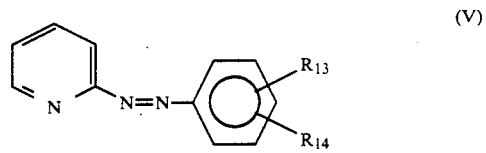

wherein $R_{13}$ and $R_{14}$ each represents a hydrogen atom, a hydroxyl group, a nitro group or a lower alkyl group, provided that at least one of $R_{13}$ and $R_{14}$ represents a hydroxyl group; and

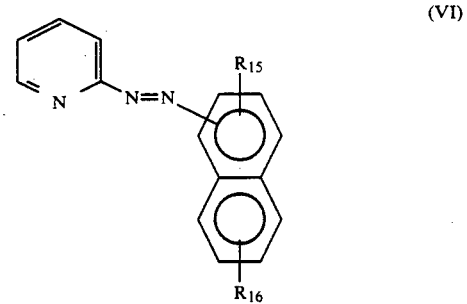

wherein $R_{15}$ and $R_{16}$ each represents a hydrogen atom or a hydroxyl group, provided that at least one of $R_{15}$ and $R_{16}$ represents a hydroxyl group.

2. The positive-working photoresist composition as in claim 1, wherein said light absorber is present in the composition in an amount of from about 0.3 to about 5% by weight based on the solid content of the positive-working photoresist composition.

3. The positive-working photoresist composition as in claim 1, wherein said alkali-soluble resin is selected from the group consisting of novolak resins, acetone-pyrogallol resins, polyhydroxystyrenes and derivatives of polyhydroxystyrenes.

4. The positive-working photoresist composition as in claim 1, wherein said alkali-soluble resin is a novolak resin.

5. The positive-working photoresist composition as in claim 4, wherein said novolak resin has a weight average molecular weight of from about 2,000 to about 30,000.

6. The positive-working photoresist composition as in claim 4, wherein said novolak resin has a weight average molecular weight of from about 6,000 to about 20,000.

7. The positive-working photoresist composition as in claim 1, wherein said 1,2-naphthoquinonediazido group-containing compound is present in the photoresist composition in an amount of from about 5 to about 100 parts by weight per 100 parts by weight of the alkali-soluble resin.

8. The positive-working photoresist composition as in claim 1, wherein said 1,2-naphthoquinonediazido group-containing compound is present in the photoresist composition in an amount of from about 10 to about 50 parts by weight per 100 parts by weight of the alkali-soluble resin.

9. The positive-working photoresist composition as in claim 1, further comprising a polar solvent or a mixture of polar solvents.

10. The positive-working photoresist composition as in claim 9, wherein said polar solvent is selected from a group consisting of ketones, alcohol ethers, ethers, cellosolve esters, fatty acid esters, and halogenated hydrocarbons.

* * * * *